(12) United States Patent
Kadowaki et al.

(10) Patent No.: US 8,945,296 B2
(45) Date of Patent: *Feb. 3, 2015

(54) WATER-REACTIVE AL-BASED COMPOSITE MATERIAL, WATER-REACTIVE AL-BASED THERMALLY SPRAYED FILM, PROCESS FOR PRODUCTION OF SUCH AL-BASED THERMALLY SPRAYED FILM, AND CONSTITUENT MEMBER FOR FILM-FORMING CHAMBER

(75) Inventors: Yutaka Kadowaki, Chiba (JP); Tomoko Saitou, Chiba (JP); Katsuhiko Mushiake, Tokyo (JP)

(73) Assignee: ULVAC, Inc., Chigasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/818,253

(22) PCT Filed: Aug. 12, 2011

(86) PCT No.: PCT/JP2011/068443
§ 371 (c)(1),
(2), (4) Date: Feb. 21, 2013

(87) PCT Pub. No.: WO2012/026349
PCT Pub. Date: Mar. 1, 2012

(65) Prior Publication Data
US 2013/0145961 A1    Jun. 13, 2013

(30) Foreign Application Priority Data

Aug. 27, 2010  (JP) ................................ 2010-191408

(51) Int. Cl.
| C09D 1/00 | (2006.01) |
| B05D 1/40 | (2006.01) |
| C22C 21/00 | (2006.01) |
| C23C 4/06 | (2006.01) |
| C23C 14/56 | (2006.01) |
| C23C 16/44 | (2006.01) |

(52) U.S. Cl.
CPC . *C09D 1/00* (2013.01); *C22C 21/00* (2013.01); *C23C 4/06* (2013.01); *C23C 14/564* (2013.01); *C23C 16/4404* (2013.01)
USPC ........................................ 106/286.5; 427/331

(58) Field of Classification Search
None
See application file for complete search history.

(56) References Cited

U.S. PATENT DOCUMENTS

2006/0249393 A1* 11/2006 Ghosh et al. .................. 205/639

FOREIGN PATENT DOCUMENTS

| JP | 11-012727 A | | 1/1999 |
| JP | 2002161325 A | * | 6/2002 |
| JP | 2002-327222 A | | 11/2002 |
| JP | 2005-256063 A | | 9/2005 |
| WO | WO 2009/133837 A1 | | 11/2009 |
| WO | WO 2011/052640 A1 | | 5/2011 |

OTHER PUBLICATIONS

English translation of JP2002161325, Jun. 2002.*

* cited by examiner

*Primary Examiner* — Melvin C Mayes
*Assistant Examiner* — Stefanie Cohen
(74) *Attorney, Agent, or Firm* — Arent Fox LLP

(57) ABSTRACT

Herein provided are a water-reactive Al-based composite material which is characterized in that it is produced by incorporating, into Al, 2.0 to 3.5% by mass of In, 0.2 to 0.5% by mass of Si and 0.13 to 0.25% by mass of Ti, and which can be dissolved in water through the reaction thereof in a water-containing atmosphere; a water-reactive Al-based thermally sprayed film produced using this composite material; a method for the production of this Al-based thermally sprayed film; and a constituent member for a film-forming chamber which is provided with this Al-based thermally sprayed film on the surface thereof.

6 Claims, 8 Drawing Sheets (a)

(b)

(a)

(b)

(a)

(b)

(a)

(b)

(a)

(b)

(a)

Immediately after immersion (b)

During reaction (c)

Base Material | Sputter-formed Film
After removal of Film (a-1)

(a-2)

(b-1)

(b-2)

WATER-REACTIVE AL-BASED COMPOSITE MATERIAL, WATER-REACTIVE AL-BASED THERMALLY SPRAYED FILM, PROCESS FOR PRODUCTION OF SUCH AL-BASED THERMALLY SPRAYED FILM, AND CONSTITUENT MEMBER FOR FILM-FORMING CHAMBER

CROSS-REFERENCED TO RELATED APPLICATIONS

This application is a National Stage entry of International Application PCT/JP2011/068443 filed Aug. 12, 2011, which claims priority to Japanese Application No. 2010-191408, filed Aug. 27, 2010, the disclosure of these prior applications are hereby incorporated in their entirety by reference.

TECHNICAL FIELD

The present invention relates to a water-reactive Al-based composite material, a water-reactive Al-based thermally sprayed film, a method for the production of such an Al-based thermally sprayed film and a constituent member for a film-forming chamber and, more particularly, the present invention pertains to a water-reactive Al-based composite material which comprises In, Si and Ti incorporated therein; a water-reactive Al-based thermally sprayed film, which consists of this water-reactive Al-based composite material; a method for the production of such an Al-based thermally sprayed film; and a constituent member for a film-forming chamber, which is covered with this A-based thermally sprayed film.

BACKGROUND ART

In the film-forming apparatus for forming a thin film according to film-forming techniques such as the sputtering technique, the vacuum evaporation technique, the ion-plating technique, and the CVD technique, a film of a metal or a metal compound constituting a film-forming material is inevitably adhered to the constituent member for the film-forming chamber to be arranged within the film-forming apparatus, during the film-forming process. As such constituent members for the film-forming chamber, there can be listed, for instance, an adhesion-inhibiting plate for avoiding any adhesion of films on the interior of the vacuum vessel other than a substrate, shutters, a mask for forming a film only on a desired area of the substrate, and a tray for transferring substrates. A film having a composition the same as that of an intended thin film (the thin film to be formed on the surface of a substrate) is also deposited on the surface of these members, during the film-forming process. In this respect, it is common that these members are repeatedly used in the film-forming process after the removal of the deposited film.

The thickness of the film inevitably adhered to these constituent members for the foregoing film-forming chamber increases along with the increase in the operating time of the film-forming process. These adhered films may easily be peeled off, in the form of particles, from the constituent members for the film-forming chamber. The formation of these particles of the adhered films is caused by any internal stress generated in the films and/or any stress generated therein due to the repeated heat history and such particles are then adhered to the surface of a substrate. The formation of such particles in turn becomes a cause of various defects of the resulting thin film. For this reason, the constituent members for the film-forming chamber are in general reused in the film-forming process after periodically subjecting them to a series of treatments, which comprises the steps of the removal of the constituent members from the film-forming chamber at such a stage that any adhered film has not yet been peeled off from the surface thereof; the removal of the adhered film through washing the constituent members; and the subsequent surface finishing treatment.

Accordingly, when used as such film-forming materials are, for instance, valuable metals such as Al, Mo, Ti, Cu, Ag, Au, Pt, Rh, Ru, Ir, Ta, W, Nb, Zr, Re, Ni, Cr, V, Li, Co, Pd, Nd, In, and Se, alloys of these metals, and oxides such as ITO, ZnO, PZT and $TiO_2$, there has been desired for the establishment of any processing technique simultaneously serving as a means for the recovery of these metals, which do not take part in the formation of a film on the surface of a substrate, but are adhered to the surface of the constituent member for the film-forming chamber other than the substrate and a means for the reuse of these constituent members.

For instance, in the case of an adhesion-inhibiting plate which is used, in a film-forming apparatus, for avoiding the adhesion of any film-forming material on the inner walls of the film-forming apparatus and on the surface of each constituent member for the film-forming chamber arranged within the film-forming apparatus, other than the substrate, it would presently be common that the constituent members are reused in the film-forming process after the removal of such materials deposited on the members. Currently used as such methods for the removal of the foregoing film-forming materials deposited on the constituent members are, for instance, the sand blasting technique, the wet etching technique which makes use of an acid or an alkali, and the film-removing technique which makes use of the hydrogen embrittlement through the use of, for instance, hydrogen peroxide, as well as the film-removing technique using electrolysis. In this connection, the adhesion-inhibiting plate or the like is not a little damaged due to the dissolution thereof when practicing the treatment for the removal of such deposited materials. Accordingly, such a constituent member is correspondingly limited in its number of reuse. For this reason, there has been desired for the development of a film-removing technique which can reduce the degree of any possible damage of the adhesion-inhibiting plate or the like as low as possible.

Moreover, if the concentration of the films deposited on the constituent members and subsequently removed from the same is low, in the waste generated during the practice of the foregoing sand blasting method or in the waste liquor originated from the chemical treatment using, for instance, an acid or an alkali, the cost required for the recovery of the valuable metals included in the waste or waste liquor becomes high and this in turn makes the recovery procedures unprofitable. In such case, the films removed from the constituent members have presently been regarded as and disposed as waste.

In addition, in the foregoing chemical treatment, it has been desired to reduce the overall quantity of the chemical solutions or liquids to be used in the treatment. This is because, not only the chemical solution or liquid, per se, used therein is quite expensive, but also the cost required for the treatment of such a chemical liquid becomes high. Moreover, the amount of the chemical solution or liquid should substantially be reduced in view of the prevention of any possible environmental pollution. Furthermore, when carrying out a chemical treatment such as one described above, the film-forming material removed from an adhesion-inhibiting plate would be converted into new chemical substances and accordingly, a further additional cost would be required for isolating or recovering only the film-forming material from the deposits removed from the adhesion-inhibiting plate. For this reason, only the film-forming materials have presently been recovered, which can compensate the recovery cost.

In addition to the foregoing methods for the removal of deposited films, there has been known a technique comprising the steps of practicing a film-forming process within a film-forming apparatus equipped with a constituent member covered with an Al-based film which consists of a water-reactive Al-based composite material having such properties that it can undergo a reaction within a water-containing atmosphere so that it can be made soluble in water; removing and separating any film deposited on the constituent member through the reaction and dissolution of the Al-based film; and then recovering, from the deposited film thus removed, the valuable metals included in the film-forming material (see, for instance, Patent Document 1 specified below). This water-reactive Al-based composite material consists of a combination of Al or an Al alloy and at least one member selected from the group consisting of In and Sn, or an alloy of these metal materials.

PRIOR ART LITERATURE

Patent Document

Patent Document 1: Japanese Un-Examined Patent Publication No. 2005-256063 Official Gazette (Claims).

DISCLOSURE OF THE INVENTION

Problems that the Invention is to Solve

It is an object of the present invention to solve the foregoing problems associated with the aforementioned prior arts and more specifically to provide an Al-based composite material which contains In, Si and Ti and can undergo a reaction within a water-containing environment so that it can be dissolved in water, an Al-based thermally sprayed film consisting of this Al-based composite material, a method for the production of this Al-based thermally sprayed film, and a constituent member for a film-forming chamber, which is covered with this Al-based thermally sprayed film.

Means for the Solution of the Problems

The water-reactive Al-based composite material according to the present invention is characterized by the incorporation, into Al, of 2.0 to 3.5% by mass and preferably 2.5 to 3.0% by mass of In, 0.2 to 0.5% by mass of Si, and 0.13 to 0.25% by mass, preferably 0.15 to 0.25% by mass and more preferably 0.17 to 0.23% by mass of Ti on the basis of the total amount of Al.

If the Al-based composite material has such a composition, the Al-based thermally sprayed film derived from such a material can easily undergo a reaction with water within a water-containing atmosphere, while generating hydrogen gas and it can thus be dissolved in water.

In this respect, if the amount of In present in the composite material is less than 2% by mass, the resulting Al-based thermally sprayed film would have such a tendency that the reactivity thereof with water is reduced, while if the amount of In exceeds 3.5% by mass, the resulting Al-based thermally sprayed film would have such a tendency that the reactivity thereof with water becomes extremely high and that the thermally sprayed film accordingly undergoes a reaction with the moisture in the atmospheric air. This makes the handling thereof quite difficult and the increase of the amount of In used in the composite material leads to a substantial increase in the production cost. Moreover, the use of Si in the composite material in an amount of less than 0.2% by mass shows such a tendency to lower the effect of controlling the reactivity of the resulting Al-based thermally sprayed film with water, while if the amount thereof exceeds 0.5% by mass, the reactivity of the Al-based thermally sprayed film with water would be liable to begin to lower and further if it exceeds 0.6% by mass, the reactivity of the Al-based thermally sprayed film with water, per se, apt to be reduced. In addition, the amount of Ti added to the composite material is less than 0.13% by mass, there is observed such a tendency to lower the solubility of the resulting Al-based thermally sprayed film after being exposed to heat history during the film-forming process due to the adverse effect of impurities present in Al, while if the amount of Ti exceeds 0.25% by mass, the added Ti is apt to cause segregation in the Al-based composite material. For this reason, when carrying out a thermal spraying operation using this material, the occurrence of such segregation becomes a cause of impairing the thermal spraying conditions and the appearance of the resulting Al-based thermally sprayed film. Regarding the added amount of Ti, if taking, into consideration, the added amount of Si and the concentration of impurities such as Cu, it is preferably not less than 0.15% by mass and more preferably not less than 0.17% by mass. Further, if taking the segregation of Ti into consideration, the amount of Ti to be incorporated into the composite material is preferably not more than 0.23% by mass.

The method for the production of a water-reactive Al-based thermally sprayed film according to the present invention is characterized in that it comprises the steps of melting a material comprising Al and 2.0 to 3.5% by mass and preferably 2.5 to 3.0% by mass of In, 0.2 to 0.5% by mass of Si, and 0.13 to 0.25% by mass, preferably 0.15 to 0.25%, by mass and more preferably 0.17 to 0.23% by mass of Ti on the basis of the total amount of Al, which are incorporated into the Al, in such a manner that the resulting molten material has a uniform composition; thermally spraying the molten material on the surface of a base material, while quenching the sprayed molten material to thus solidify the same and to thereby form a desired film.

The water-reactive Al-based thermally sprayed film according to the present invention is characterized in that it consists of the foregoing water-reactive Al-based composite material.

The constituent member for constituting the film-forming chamber of a film-forming apparatus according to the present invention is characterized in that it is provided with the foregoing water-reactive Al-based thermally sprayed film on the surface thereof.

The foregoing constituent member is characterized in that it is an adhesion-inhibiting plate, a shutter or a mask.

Effect of the Invention

The Al-based thermally sprayed film consisting of the water-reactive Al-based composite material according to the present invention shows various effects such that it can easily be produced by a simple process at a low cost; that this Al-based thermally sprayed film certainly has such an ability to undergo a reaction in an atmosphere containing water and to dissolve in water even after it is exposed to heat history at a temperature ranging from about 250 to about 300° C. during the film-forming process; that the initial reactivity (activity) and/or solubility of the film prior to the exposure to the heat history (during the formation of the film) can be controlled by the incorporation of desired amounts of Si and Ti; and that the solubility of the Al-based thermally sprayed film after the exposure to the heat history can be maintained over a desired time period.

Moreover, the Al-based thermally sprayed film according to the present invention also has such an effect that it is improved in not only the weatherability, but also the strength due to the incorporation of Si into the film.

Furthermore, the Al-based thermally sprayed film according to the present invention also shows such an effect that the film can undergo a reaction with water in the presence thereof and it is thus efficiently dissolved in water while generating hydrogen gas and therefore, if an intended film is formed using a film-forming apparatus equipped with constituent members (such as an adhesion-inhibiting plate, a shutter and a mask) used for constructing a film-forming chamber, which is covered with this water-reactive Al-based thermally sprayed film, the inevitably deposited film consisting of a film-forming material and adhered to the surface of the constituent members such as an adhesion-inhibiting plate during the film-forming process can be removed or separated from the constituent members through the reaction of the Al-based thermally sprayed film with water and through the dissolution thereof in water. Accordingly, any valuable metals included in the film-forming material can easily be recovered from the inevitably adhered films thus removed from the constituent members and as a result, the number of reuse of these constituent members can likewise be increased substantially.

MODE FOR CARRYING OUT THE INVENTION

Figure 1:
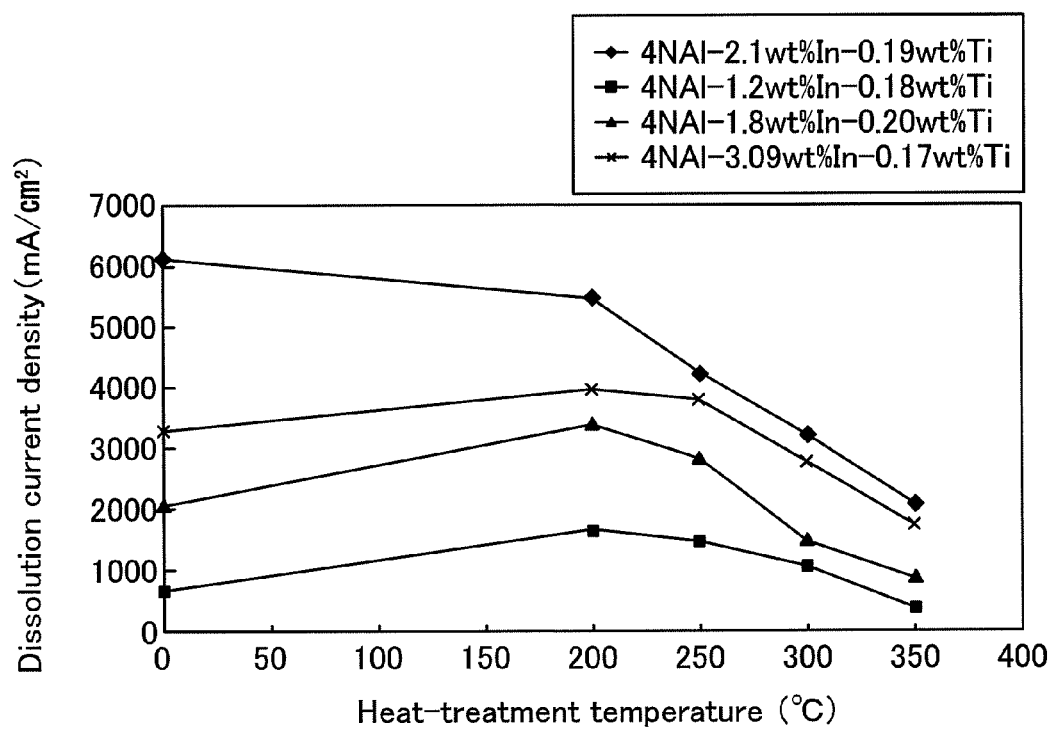
FIG. 1 is a graph showing the relation between the heat-treatment temperature (° C.) and the dissolution current density (mA/cm$^2$) observed for the Al-based thermally sprayed film prepared in Reference Example 2 while using an Al—In—Ti composite material.

When producing a thin film according to a variety of film-forming techniques such as the sputtering technique, while using a film-forming apparatus, the film-forming chamber of the apparatus is repeatedly placed under the influence of heat history. For this reason, the surface of a constituent member placed within the film-forming chamber such as an adhesion-inhibiting plate, which has been coated with the Al-based thermally sprayed film according to the present invention is likewise repeatedly exposed to such heat history. Accordingly, the Al-based thermally sprayed film should easily be handleable, when it is applied onto the surface of a base material and before the exposure thereof to heat history. Furthermore, the Al-based thermally sprayed film, on which a film or layer consisting of the film-forming material is inevitably adhered or deposited after the exposure thereof to heat history during the film-forming process, should likewise have solubility (activity) sufficient for permitting the easy removal of the Al-based thermally sprayed film from the base material together with the film inevitably adhered to the same and should also be stable. In this respect, the water-reactive Al-based thermally sprayed film according to the present invention can completely satisfy such a requirement for the solubility in water.

The upper limit of the temperature of the heat history within the foregoing film-forming chamber is, for instance, on the order of about 250 to 300° C. (this is represented by that observed for the adhesion-inhibiting plate) for the film-forming methods such as the sputtering technique, the vacuum evaporation technique, the ion-plating technique and the CVD technique and accordingly, it is in general sufficient, from the practical standpoint, that the Al-based thermally sprayed film, which has experienced such heat history of up to a temperature of 250° C., possesses desired water-reactivity and it is more preferred that the Al-based thermally sprayed film, which has experienced such heat history of up to a temperature of 300° C., possesses desired water-reactivity. As will be detailed below, the water-reactive Al-based thermally sprayed film according to the present invention substantially satisfies such a requirement for the solubility.

The foregoing solubility of a water-reactive Al-based thermally sprayed film can be evaluated by immersing a base material, whose surface is covered with an Al-based thermally sprayed film, in hot water maintained at a predetermined temperature (in general ranging from 40 to 130° C. and preferably 80 to 100° C.) and then determining the current density thereof (in the present invention, this is referred to as "dissolution current density" ($mA/cm^2$)) in the liquid. This determination method corresponds to one comprising the steps of determining the weight loss of a sample before and after the immersion of the sample in a processing liquid and then converting the weight loss thus obtained into the current density value while taking, into account, the surface area of the sample, the time period during which the sample is immersed in the processing liquid, or the like. If the dissolution current density as determined according to this method is not less than 50 $mA/cm^2$, there can be so concluded that the Al-based thermally sprayed film has solubility (activity) in water sufficient for making the Al-based thermally sprayed film easily removable from the base material together with a deposit which consists of the film-forming material inevitably adhered to the thermally sprayed film, even after the exposure thereof to the heat history encountered during the film-forming process.

Now, some modes for carrying out the invention will hereunder be described in detail.

In the Al-based thermally sprayed film consisting of the water-reactive Al-based composite material, according to the present invention, a predetermined amount of In is highly uniformly dispersed in the Al material as a principal component of the composite material and therefore, the thermally sprayed film can easily undergo a reaction with water in a moisture-containing atmosphere such as water, water vapor or an aqueous solution and the film can thus be dissolved in such a water-containing environment. The Al material used in the composite material according to the present invention may be, for instance, those each having a purity of 2N (99%), 3N (99.9%), 4N (99.99%) and 5N (99.999%). Among them, the 4N Al and 5N Al materials can be prepared by, for instance, subjecting the 2N Al or 3N Al produced according to the electrolysis to a purification method such as the three layer electrolysis process or the partial solidification technique (segregation technique), which makes the most use of the difference in the temperature between the solid and liquid phases upon the solidification procedures. Principal impurities present in these Al materials are Fe and Si as well as Cu, Ni, C and the like. In the present invention, preferably used as the Al materials are those each having the following impurity contents: Fe on the order of less than about 150 ppm and Cu on the order of less than about 40 ppm.

In general, the electrochemical potential difference between Al and In is considerably high in the Al—In system, but if naturally occurring oxidized film of Al is present therein, any ionization of Al is never advanced. However, once the naturally occurring oxidized film is broken and Al is directly bound to In, the potential difference between them would abruptly accelerate the ionization of Al. At this stage, In is present in the Al crystal grains in a highly dispersed state and in its original state without undergoing any chemical change. In has a low melting point (157° C.) and never forms any solid solution with Al. Accordingly, if melting Al and In such a manner that a uniform composition of Al and In can be established, while paying attention to the difference in density between Al and In, to thus form a composite material and then applying the resulting composite material onto the surface of a base material according to the thermally spraying technique, a desired film can thus be obtained due to the effect of the solidification through quenching and the compressive action generated during the solidification.

The In added to the Al material is highly dispersed in the Al-based crystalline grains of the material due to the thermal spraying process and maintains its condition such that it directly comes in close contact with Al. Since In never forms any stable layer with Al, the resulting Al/In interface is maintained in its highly energetic state and accordingly, Al can undergo a vigorous reaction with water at the contact surface existing between them within a moisture-containing atmosphere. In addition, the reaction product mainly comprising AlOOH is not formed into a film on the surface, but formed into fine particles, which are in turn dispersed into the liquid, and accordingly, the dissolution reaction is continuously and explosively proceeds at the reaction interface which is renewed successively, because of the presence of the added In element in its highly dispersed state and the mechanical action caused due to the expansion of $H_2$ gas which is generated with the progress of the foregoing reaction.

The behavior of the Al—In system as has been described above becomes more conspicuous, the more the purity of Al is high. More specifically, the more conspicuous behavior of the system would be observed when using 4N and 5N Al as compared with that observed when using 3N Al, as an Al material.

The aforementioned Al-based thermally sprayed film consisting of the 4N Al—In composite material already has a high activity at the stage of its production through the thermal spraying process and the solubility thereof in a water-containing atmosphere is too high and this accordingly makes the handling thereof considerably difficult. If Si and Ti are incorporated into the composite material in predetermined amounts, however, the resulting Al-based thermally sprayed film has a substantially reduced initial reactivity (activity) and the handling thereof would become easy. More specifically, if Ti is incorporated into the Al-based composite material, the resulting Al-based thermally sprayed film would certainly be improved in its activity even after the film has experienced heat history and the film also shows a high solubility (activity) within a water-containing atmosphere and this would correspondingly permit the easy removal of the Al-based thermally sprayed film from a certain base material to which the thermally sprayed film is adhered. On the other hand, if Si is incorporated into the Al-based composite material, the resulting Al-based thermally sprayed film would substantially be improved in its strength as the added amount of Si is increased and the film would likewise be improved in its weatherability. More specifically, the strength of the resulting thermally sprayed film is increased to a level of about 1.7 times that observed for the Al-based thermally sprayed film consisting of 5N Al-3 wt % In, while the weatherability thereof is clearly improved as compared with the Al-based thermally sprayed film consisting of 5N Al-3 wt % In.

The present invention will hereunder be described in more detail with reference to the water-reactive Al-based composite material consisting of a 4N Al—In—Si—Ti system taken by way of example. The Al-based thermally sprayed film of the present invention is produced by forming a film on the surface of a base material to be processed in a predetermined atmosphere according to the thermal spraying technique while using an Al—In—Si—Ti composite material in which In, Si and Ti are uniformly dispersed in a matrix of Al. The resulting thermally sprayed Al—In—Si—Ti film contains In crystalline grains (having a grain size of not higher than 10 nm) which are highly uniformly dispersed in Al crystalline grains.

The foregoing Al-based thermally sprayed film can, for instance, be produced according to the method described below. The method comprises the steps of providing 4N Al, In, Si and Ti materials; incorporating, into the Al material, 2.0 to 3.5% by mass and preferably 2.5 to 3.0% by mass of the In material, 0.2 to 0.5% by mass of the Si material, and 0.13 to 0.25% by mass, preferably 0.15 to 0.25% by mass and more preferably 0.17 to 0.23% by mass of the Ti material, on the basis of the total mass of Al; melting the resulting blend to thus allow the In, Si and Ti materials to be uniformly dispersed in the Al material; forming the molten blend into a rod or a wire which will subsequently be used as a material for thermal spray; thermally spraying the material therefor on the surface of a base material, for instance, a constituent member of the film-forming chamber such as an adhesion-inhibiting plate of a film-forming apparatus according to, for instance, the flame spraying technique, while allowing the material thus thermally sprayed on the surface of the base material to quench and solidify and to thereby cover the surface of such a constituent member. Thus any base material can be produced, which is provided with a desired water-reactive Al-based thermally sprayed film on the surface thereof. The thermally sprayed film produced according to the foregoing method is one in which In and the like are highly uniformly dispersed within the Al crystalline grains, as has been discussed above.

In the case of the Al-based thermally sprayed film produced by incorporating desired amounts of Si and Ti into an Al—In system according to the method discussed above, the solubility, in water, of the film per se produced by the thermal spraying technique can satisfactorily be controlled. For this reason, any accidental or premature dissolution of the resulting thermally sprayed film due to the reaction thereof with the moisture present in the atmosphere surrounding the same and this accordingly makes the handling thereof quite easy. Moreover, if an Al-based thermally sprayed film is produced using an Al-based composite material which contains predetermined amounts of In, Si and Ti incorporated into the same, the resulting thermally sprayed film would have a practically acceptable solubility even when the upper limit of the temperature of the heat history, to which the thermally sprayed film is exposed within a film-forming chamber during the formation thereof, is on the order of about 300° C. or about 350° C.

Thus if the base material, whose surface is coated with an Al-based thermally sprayed film according to the foregoing method, is immersed in warmed water (deionized water) or sprayed with water vapor, for instance, if the base material is immersed in warmed water maintained at a desired temperature, the reaction of the film with water is initiated immediately after the immersion with the generation of hydrogen gas and if the reaction further proceeds, the color of the water is changed to black due to the separation of In and the like and the thermally sprayed film is finally dissolved completely in water. As a result, precipitates consisting of, for instance, Al, In, Si and Ti remain in the warmed water. The reaction proceeds more vigorously, the more the temperature of water used for the immersion becomes high.

The thermally sprayed film of the present invention has been described above while taking an embodiment in which the film is formed according to the flame spraying technique using a material therefor in the form of a rod or a wire, by way of example, but the thermally sprayed film can likewise be produced according to the flame spraying technique in which a powdery material for thermal spray is used and further the arc spraying technique or the plasma spraying technique can likewise be substituted for the flame spraying technique. In the present invention, the foregoing raw material is melted, sprayed on the surface of a base material while quenching and solidifying the sprayed raw material on the base material to thus form a thermally sprayed film.

As has been discussed above, if using a base material whose surface has previously been covered with the aforementioned water-reactive Al-based thermally sprayed film, as a constituent member for a film-forming chamber such as an adhesion-inhibiting plate or a shutter arranged within the film-forming chamber of a film-forming apparatus, any film consisting of a film-forming material inevitably adhered to or deposited on the surface of such a constituent member can easily be removed from the constituent member after the film-forming process is repeated over a predetermined times and any valuable metals included in the adhered film can thus easily be removed or recovered and then reused.

In this case, used as a liquid for peeling treatment is not one containing any chemical reagent, but simple water such as pure water, water vapor or an aqueous solution. Therefore, the present invention can surely permit the prevention of the occurrence of any damage of the constituent member for a film-forming chamber such as an adhesion-inhibiting plate due to the dissolution of the constituent member in the treating liquid and the constituent members treated according to the present invention can be used (or reused) over a considerably increased number of times as compared with that observed when the peeling operation is carried out using a chemical agent. In addition, this in turn results in the significant reduction of the processing cost and the protection of the surrounding environment since any chemical agent is not used at all in the peeling operation. Furthermore, the film-forming materials possibly adhered to or deposited on the constituent members such as an adhesion-inhibiting plate during the film-forming operation is insoluble in water in most of cases and the present invention has an advantage in that recovered after the foregoing peeling procedures is a solid material having the same composition and form observed for the film-forming material per se. Moreover, not only the cost required for the recovery can substantially be reduced, but also the steps required for the recovery can likewise be simplified and accordingly, the present invention also has such a merit that it can permit the recovery of a wide variety of materials. For instance, in the case where a film-forming material used is or comprises an expensive metal such as a precious metal or a rare metal, the film which is inevitably adhered to a constituent member for a film-forming chamber such as an adhesion-inhibiting plate during the film-forming procedures and which consists of the film-forming material, can easily be removed from the constituent member simply by immersing the member in water or by spraying water vapor on the member if a film consisting of the water-reactive Al-based composite material according to the present invention is applied onto the surface of the constituent member in advance. Consequently, such a precious metal or a rare metal can be recovered without accompanied by any contamination thereof. Saying over again, the present invention permits the reduction of the recovery cost and also permits the recovery of any film-forming material of high quality.

The present invention will hereunder be described in more detail with reference to the following Reference Examples and Working Examples.

Reference Example 1

A material for thermal spray was prepared by blending, in a desired mixing ratio, 4N Al, In and Si materials, melting the resulting blend to uniformly disperse the In and Si materials in the Al material, and then forming the resulting molten material (4N Al-3.0% by mass In-0.1% by mass Si, wherein the added amounts of the In and Si materials are expressed in terms of those relative to the mass of the Al material) into a rod-like shape. The resulting rod-like material for thermal spray was thermally sprayed on the surface of a base material consisting of Al within the atmospheric environment according to the rod flame spraying technique (heat source: $C_2H_2$—$O_2$ gas; temperature: about 3,000° C.) to thus give an Al-based thermally sprayed film on the surface of the base material. The Al-based thermally sprayed film thus formed was then subjected to a heat treatment at a temperature ranging from 0 to 350° C. (the treatment was carried out for one hour in the atmosphere and subsequently the film was subjected to furnace cooling) in place of the heat history to which the film was possibly exposed during the film-forming process. Then the solubility, in water, of the Al-based thermally sprayed film was investigated by dipping, in 300 mL of deionized water maintained at 80° C., the base material provided thereon with the thermally sprayed film prior to the heat treatment (0° C.) or after the completion of the heat treatment and then determining the current density of the resulting dipping liquids.

As a result, it was found, from the effect of the addition of Si on the solubility of the Al-based thermally sprayed film, that the addition of a desired amount of Si would permit the control of the activity or solubility of the resulting thermally sprayed film immediately after the formation thereof according to the thermally spraying technique and prior to the heat treatment. However, there was observed such a tendency that if the temperature of the heat treatment is high, for instance, on the order of 250 to 350° C., any thermally sprayed film cannot be obtained, which shows practically acceptable solubility.

Reference Example 2

In this Reference Example, the effects of the added In and Ti on the characteristic properties of the following Al—In—Ti compositions (a) to (d) were investigated, while using 4N Al as the Al component. The added amounts of In and Ti are expressed in terms of those relative to the total mass of the Al component used.

(a) 4N Al-2.1% by mass In-0.19% by mass Ti;
(b) 4N Al-1.2% by mass In-0.18% by mass Ti;
(c) 4N Al-1.8% by mass In-0.20% by mass Ti;
(d) 4N Al-3.0% by mass In-0.17% by mass Ti;

There were blended Al, In and Ti materials in a predetermined mixing ratio, then the resulting blend was melted to thus make the In and Ti materials uniformly disperse in the Al material and then formed into a rod-like shape to thus give a material for thermal spray. The resulting rod-like material for thermal spray was thermally sprayed on the surface of a base material consisting of Al within the atmospheric environment according to the rod flame spraying technique (heat source: $C_2H_2$—$O_2$ gas; temperature: about 3,000° C.) to thus give an Al-based thermally sprayed film on the surface of the base material. The Al-based thermally sprayed film thus formed was then subjected to a heat treatment at a temperature ranging from 0 to 350° C. (the treatment was carried out for one hour in the atmosphere and subsequently the film was subjected to furnace cooling) in place of the heat history to which the film was possibly exposed during the film-forming process. Then the solubility, in water, of the Al-based thermally sprayed film was investigated by dipping, in 300 mL of deionized water maintained at 80° C., the base material provided thereon with the thermally sprayed film prior to the heat treatment (0° C.) or after the completion of the heat treatment and then determining the current density of the resulting dipping liquids. The results thus obtained are plotted on the attached FIG. 1. In FIG. 1, the heat treatment temperature (° C.) is plotted as abscissa and the dissolution current density (mA/cm$^2$) is plotted as ordinate.

The results plotted on FIG. 1 clearly indicate that, in the case of the Al—In—Ti system, the solubility of the resulting Al-based thermally sprayed film has such a tendency that it shows a substantial change, beginning at an In concentration of about 2% by mass and, in particular, the solubilities of the Al-based thermally sprayed films heat-treated at a temperature of not less than 250° C. are almost identical to one another for the films whose In concentrations are set at levels of about 2% by mass and about 3% by mass, respectively. On the other hand, if the In concentration is less than 2% by mass, the solubilities of the Al-based thermally sprayed films heat-treated at a temperature of not less than 250° C. are liable to be reduced. For this reason, when adding, to an Al-based thermally sprayed film, an element having an ability of reducing the solubility of the thermally sprayed film, such as Si as shown in Reference Example 1, although this is not shown in FIG. 1, the use of In at a concentration ranging from at least not less than about 2% by mass and not more than about 3.5% by mass would be considered as reasonable in order to achieve the intended purpose of the present invention.

As has been discussed above, if In is well dispersed in the thermally sprayed film and the amount thereof dispersed in the film is high, the reactivity of the Al-based thermally sprayed film is high even when the film is heat-treated at a high temperature. In other words, there would be observed such a tendency that the reactivity of the resulting Al-based thermally sprayed film becomes more higher, the more the concentration of In used is high.

Consequently, in the case of the Al—In—Si—Ti system, it would be recognized that the Al-based thermally sprayed film heat-treated at a high temperature shows preferred or satisfactory solubility, if the In concentration falls within the range of from about 2 to 3% by mass.

Example 1

A material for thermal spray was prepared by blending, in a desired mixing ratio, 4N Al, In, Si and Ti materials, melting the resulting blend to uniformly disperse the In, Si and Ti materials in the Al material, and then forming, into a rod-like shape, the resulting molten material: 4N Al-3.0% by mass In-0.2% by mass Si-0.2% by mass Ti (wherein the added amounts of the In, Si and Ti materials are expressed in terms of those relative to the mass of the Al material). The resulting rod-like material for thermal spray was thermally sprayed on the surface of a base material consisting of Al within the atmospheric environment according to the rod flame spraying technique (heat source: $C_2H_2$—$O_2$ gas; temperature: about 3,000° C.) to thus give an Al-based thermally sprayed film on the surface of the base material. The Al-based thermally sprayed film thus formed (pseudo deposited film) was inspected for the relation between the heat treatment time period (0 to 500 hours) at 250° C. in the atmosphere and the removability of the film (the time required for the removal of the film) observed when it was immersed in deionized water at 80° C. In addition, for the sake of comparison, an Al-based thermally sprayed film consisting of 5N Al-3.0% by mass In (a conventional Al-based thermally sprayed film (pseudo deposited film)) was separately produced and the peelability of the resulting thermally sprayed film was likewise investigated according to the same method used above.

Figure 2:
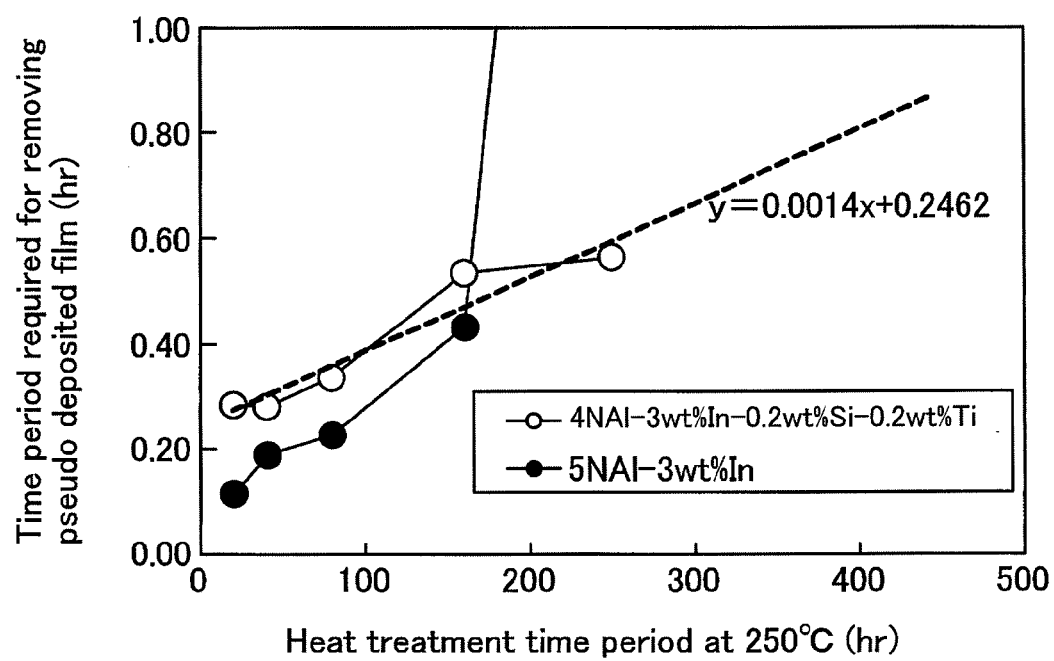
FIG. 2 is a graph showing the relation between the time of heat-treatment (hr) and the time (hr) required for the removal of the adhered film, observed for the Al-based thermally sprayed film prepared in Example 1.

The results thus obtained are plotted on the attached FIG. 2. In FIG. 2, the time period (hour) of the heat treatment carried out at 250° C. is plotted as abscissa and the time period (hour) required for the removal of the pseudo deposited film is plotted as ordinate. As will be clear from the data plotted on FIG. 2, the conventional Al-based thermally sprayed film (pseudo deposited film) cannot be removed from the base material at a time when the film have been heat-treated over about 160 hours or longer, while the Al-based thermally sprayed film (pseudo deposited film) according to the present invention can be removed within about 30 minutes up to the heat treatment time period of about 250 hours. It would be presumed that even the Al-based thermally sprayed film heat-treated over a time period of up to about 400 hours may be removed within about 48 minutes on the basis of the approximate equation (y=0.0014x+0.2462) as indicated in FIG. 2 while taking the foregoing tend into consideration.

Example 2

A material for thermal spray was prepared by blending, in a desired mixing ratio, 4N Al, In, Si and Ti materials, melting the resulting blend to uniformly disperse the In, Si and Ti materials in the Al material, and then forming, into a rod-like shape, the resulting molten material: 4N Al-3.0% by mass In-0.58% by mass Si-0.18% by mass Ti, 4N Al-3.0% by mass In-0.54% by mass Si-0.18% by mass Ti, or 4N Al-2.77% by mass In-0.42% by mass Si-0.21% by mass Ti (wherein the added amounts of the In, Si and Ti materials are expressed in terms of those relative to the mass of the Al material). The resulting rod-like material for thermal spray was sprayed on the surface of a base material consisting of Al within the atmospheric environment according to the rod flame spraying technique (heat source: $C_2H_2$—$O_2$ gas; temperature: about 3,000° C.) to thus give each corresponding Al-based thermally sprayed film on the surface of the base material. Each of the Al-based thermally sprayed films thus formed (pseudo deposited films) was inspected for the relation between the heat treatment time period (0 to 250 hours) at 250° C. in the atmosphere and the removability of the film (the time required for the removal of the film) observed when it was immersed in deionized water at 80° C. In addition, for the sake of comparison, an Al-based thermally sprayed film consisting of 5N Al-3.0% by mass In (a conventional Al-based thermally sprayed film (pseudo deposited film)) was separately produced and the peelability of the resulting thermally sprayed film was likewise investigated according to the same method used above.

Figure 3:
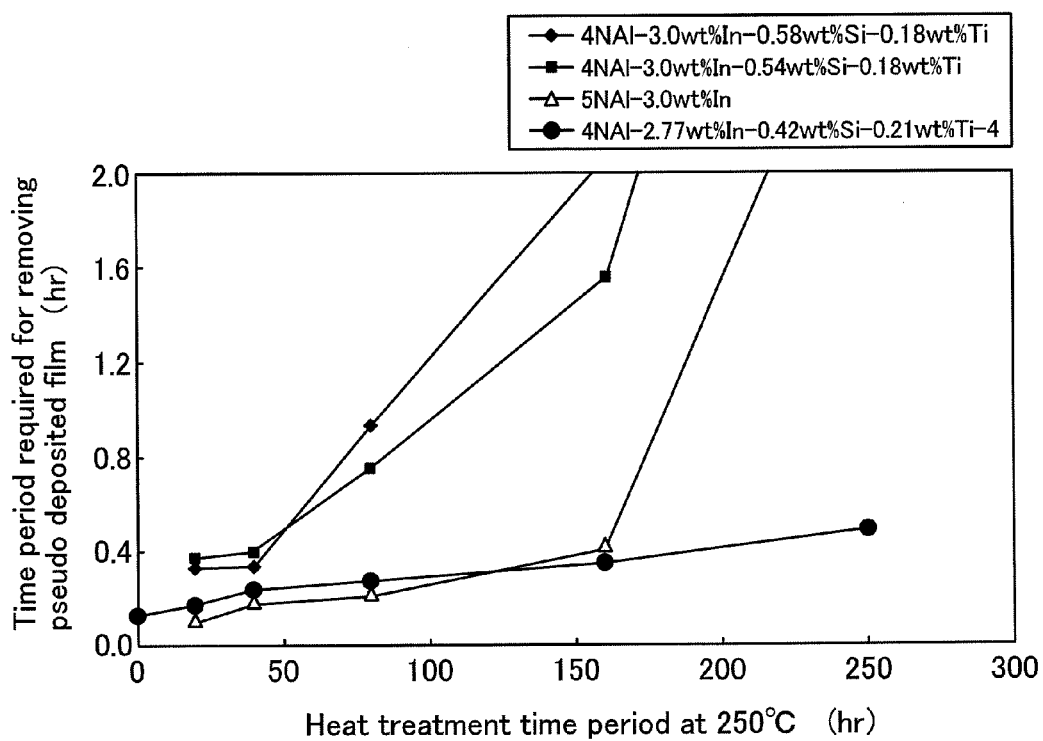
FIG. 3 is a graph illustrating the relation between the time of heat-treatment (hr) and the time (hr) required for the removal of the adhered film, observed for the Al-based thermally sprayed film prepared in Example 2.

The results thus obtained are plotted on the attached FIG. 3. In FIG. 3, the time period (hour) of the heat treatment carried out at 250° C. is plotted as abscissa and the time period (hour) required for the removal of the pseudo deposited film is plotted as ordinate. As will be clear from the data plotted on FIG. 3, both of the Al-based thermally sprayed film (pseudo deposited film) containing Si in an amount of higher than 0.5% by mass and the conventional one cannot be removed from the base materials if the heat treatment time period exceeds about 160 hours, but the Al-based thermally sprayed film (pseudo deposited film) containing Si in an amount of not more than 0.5% by mass according to the present invention can be removed from the base material within about 30 minutes if the heat treatment time period is up to about 250 hours.

Example 3

In consideration of the results obtained in Reference Example 2, various kinds of Al-based thermally sprayed films of an In—Ti system, an In—Cu—Ti system, and an In—Si—Ti system were prepared using 3N Al or 4N Al as an Al source and the resulting Al-based thermally sprayed films each were inspected for the relation between the added amounts of In, Si, and Ti and the solubility of the resulting thermally sprayed film. In this respect, the added amounts of In, Cu, Si and Ti are expressed in terms of those relative to the total mass of the Al component used.

(a) 3N Al-2.09% by mass In-0.1% by mass Ti;
(b) 4N Al-2.89% by mass In-0.13% by mass Ti;
(c) 4N Al-3.33% by mass In-0.004% by mass Cu-0.17% by mass Ti;
(d) 4N Al-3.09% by mass In-0.17% by mass Ti;
(e) 3N Al-3.1% by mass In-0.11% by mass Ti;
(f) 3N Al-2.78% by mass In-0.11% by mass Ti;
(g) 4N Al-2.9% by mass In-0.12% by mass Si-0.06% by mass Ti;
(h) 4N Al-2.8% by mass In-0.22% by mass Si-0.21% by mass Ti;
(i) 4N Al-3.0% by mass In-0.2% by mass Si-0.13% by mass Ti;
(j) 4N Al-2.8% by mass In-0.28% by mass Si-0.15% by mass Ti;
(k) 4N Al-3.0% by mass In-0.30% by mass Si-0.23% by mass Ti;
(l) 4N Al-3.0% by mass In-0.21% by mass Si-0.21% by mass Ti;
(m) 4N Al-2.0% by mass In-0.40% by mass Si-0.17% by mass Ti;
(n) 4N Al-2.5% by mass In-0.50% by mass Si-0.25% by mass Ti;
(o) 4N Al-2.0% by mass In-0.55% by mass Si-0.30% by mass Ti;
(p) 4N Al-2.5% by mass In-0.18% by mass Si-0.1% by mass Ti.

Figure 4:
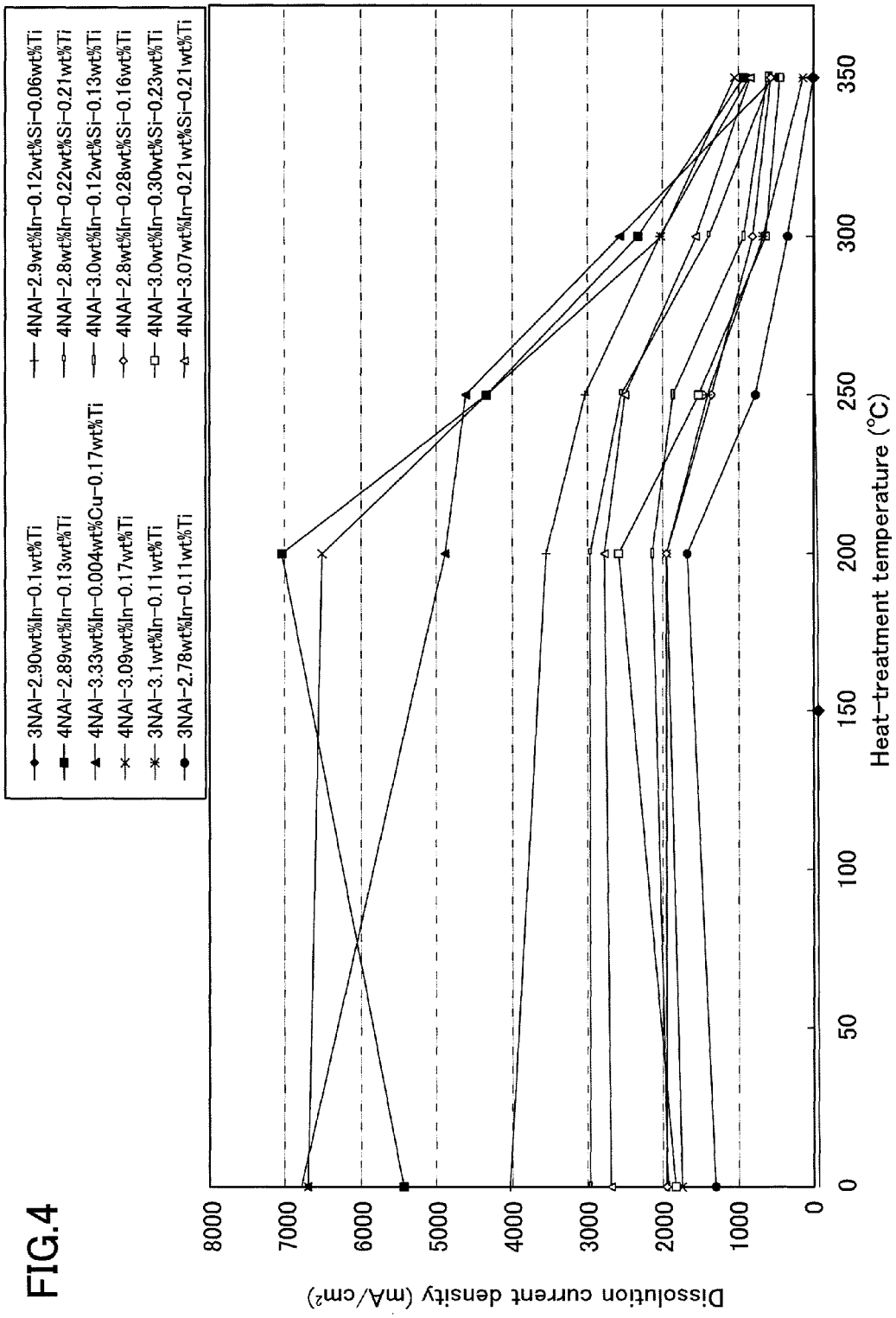
FIG. 4 is a graph illustrating the relation between the heat-treatment temperature (° C.) and the dissolution current density (mA/cm$^2$) observed for the Al-based thermally sprayed film prepared in Example 3.

Materials for thermal spray each were prepared by blending, in a desired mixing ratio, Al, In, Si, Ti and Cu materials, melting each of the resulting blends to uniformly disperse the In, Si, Ti and/or Cu materials in the Al material, and then forming each of the resulting molten materials into a rod-like shape. The resulting rod-like materials for thermal spray each were thermally sprayed on the surface of a base material consisting of Al within the atmospheric environment according to the rod flame spraying technique (heat source: $C_2H_2$—$O_2$ gas; temperature: about 3,000° C.) to thus give each corresponding Al-based thermally sprayed film on the surface of the base material. Each of the Al-based thermally sprayed films thus formed was then subjected to a heat treatment at a temperature ranging from 0 to 350° C. (the treatment was carried out for one hour in the atmosphere and then the film was subjected to furnace cooling) in place of the heat history to which the film would possibly be exposed during the film-forming process. Then the solubility, in water, of each Al-based thermally sprayed film was investigated by dipping, in 300 mL of deionized water maintained at 80° C., each base material provided thereon with each thermally sprayed film prior to the heat treatment (0° C.) or after the completion of the heat treatment and then determining the current density of the resulting dipping liquids. The results thus obtained are plotted on the attached FIG. 4 for the aforementioned compositions (a) to (l). In FIG. 4, the heat treatment temperature (° C.) is plotted as abscissa and the dissolution current density (mA/cm$^2$) is plotted as ordinate.

In this respect, it was found that the foregoing compositions (m) and (n) show the behavior similar to that observed for the foregoing composition (k) and that the foregoing compositions (o) and (p) show the behavior similar to that observed for the foregoing composition (g).

As will be clear from the data plotted on FIG. 4, if the added amount of Ti is around 0.1% by mass, the solubility of the Al-based thermally sprayed film which has just passed the heat treatment stage is reduced and accordingly, at least 0.13% by mass of Ti should be added to the thermally sprayed film. This is because if the added amount of Ti is less than 0.13% by mass, there would be observed such a tendency that the Al-based thermally sprayed film after the exposure thereof to the heat history during the film-forming process has a reduced solubility due to the adverse effect of the impurities present in the starting Al material, while if it exceeds 0.25% by mass, the Ti component is liable to cause segregation in the Al-based composite material and accordingly, when an Al-based thermally sprayed film is produced using such a material, the conditions of the thermally sprayed film and the visual appearance of the resulting Al-based thermally sprayed film are impaired because of such tendency of causing segregation. For this reason, the amount of Ti to be incorporated into the Al-based composite material is preferably not less than 0.15% by mass and more preferably not less than 0.17% by mass while taking into consideration the added amount of Si and the concentration of impurities such as Cu and further the amount of Ti is preferably not more than 0.23% by mass, while taking the possibility of Ti segregation into account.

In addition, if the added amount of Si is less than 0.2% by mass, the ability of Si to control the reactivity, with water, of the resulting Al-based thermally sprayed film is liable to be reduced, while if the added amount thereof exceeds 0.5% by mass, there is observed such a tendency that the reactivity of the resulting Al-based thermally sprayed film with water starts to decrease.

The addition of desired amounts of Si and Ti to the Al-based composite material would certainly permit the control of the initial reactivity (activity) of the Al-based thermally sprayed film which has just been produced according to the thermal spray technique and which has not been subjected to any heat treatment and, in other words, the solubility of the thermally sprayed film and the use of desired amounts of Si and Ti would accordingly permit the inhibition of any dissolution of the thermally sprayed film due to the reaction thereof with moisture present in the atmospheric environment. Moreover, if the upper limit of the temperature of the heat history inevitably encountered within the film-forming chamber falls within the range of from about 300 to 350° C., an Al-based thermally sprayed film having a practically acceptable solubility can be produced by forming the same using an Al-based composite material which comprises 2 to 3% by mass of In, 0.2 to 0.5% by mass of Si and 0.13 to 0.25% by mass of Ti, incorporated into the material.

If immersing a base material provided thereon with an excellently water-soluble Al-based thermally sprayed film of the foregoing Al—In—Si—Ti system, which had been subjected to the heat treatment described above, by immersing it in deionized water maintained at a temperature of 80° C., the reaction of the thermally sprayed film with water is initiated immediately after the immersion, while vigorously generating hydrogen gas and if the reaction further proceeds, the water is blackened due to the presence of the precipitated In or the like. Finally, the Al-based thermally sprayed film is finely divided into fine particles because of the vigorous reaction thereof with water and as a result, the Al-based film can be dissolved in water. Consequently, it can be said that the Al-based composite material according to the present invention is reactive with water (water-reactive).

As has been described above, the Al-based thermally sprayed film of the present invention which has just been prepared through the thermal spray technique and prior to the exposure thereof to any heat treatment should not have any particularly high solubility in water, but the Al-based thermally sprayed film should have physical properties such that the solubility thereof in water is high up to a certain point, after the exposure thereof to a heat treatment.

Example 4

A Cu film was deposited on a base material of aluminum (using base materials each having uneven or rough surface and those having flat or smooth surface), whose surface had been covered with an Al-based thermally sprayed film (having a thickness of 200 μm) consisting of 4N Al-3.0% by mass In-0.2% by mass Si-0.2% by mass Ti and prepared according to the method described in Example 3, over a predetermined time period according to the sputter film-forming technique under the known conditions (10$^{-3}$ Pa, DC plasma). Thereafter, each base material carrying a Cu film thus formed and adhered to the Al-based thermally sprayed film of the base material was treated with warmed water (deionized water) maintained at a temperature of 80° C. or a temperature ranging from 90 to 96° C. over a predetermined time period to thus inspect each sample for the removability thereof. Separately, for the purpose of comparison, a Cu film was likewise deposited on the Al-based thermally sprayed film consisting of 5N Al-3.0% by mass In (hereunder referred to as "conventional Al-based thermally sprayed film"), which had been formed on the same base material used above, according to the sputter film-forming technique and then the film-removability thereof was investigated according to the same method used above. The results thus obtained can be summarized as follows:

Test for Estimating Removability of Sputtered Cu Film:
  Thickness of Al-Based Thermally Sprayed Film: 150 to 200 pm;
  Temperature of Base Material: 280° C.;
  Thickness of Sputtered Cu Film: 2.5 mm;
  Sputtering Time Period: 130 hours.

Figure 5:
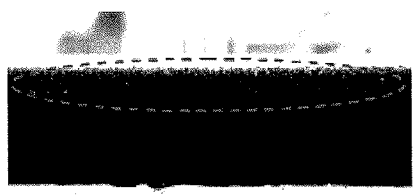
FIG. 5 shows photographs for illustrating the adhesion, to a base material, of the Al-based thermally sprayed film according to the present invention, which is produced in Example 4, and more specifically, the photograph (a) is one illustrating the adhesion of the Al-based thermally sprayed film to a base material whose surface is uneven or rough and the photograph (b) is one illustrating the adhesion of the Al-based thermally sprayed film to a base material whose surface is flat or smooth.
Figure 5:
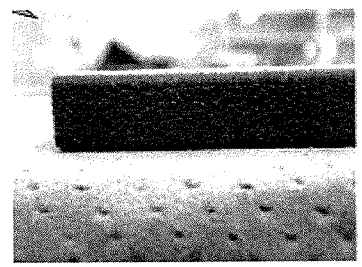
Figure 6:
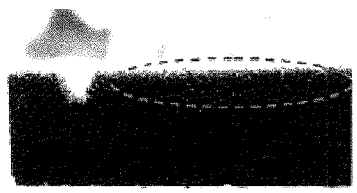
FIG. 6 shows photographs for illustrating the adhesion, to a base material, of the Al-based thermally sprayed film according to a conventional technique, which is produced in Example 4, and more specifically, the photograph (a) is one illustrating the adhesion of the conventional Al-based thermally sprayed film to a base material whose surface is uneven or rough and the photograph (b) is one illustrating the adhesion of the conventional Al-based thermally sprayed film to a base material whose surface is flat or smooth.
Figure 6:
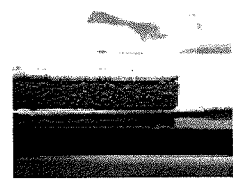
Figure 7:
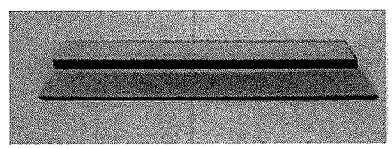
FIG. 7 shows photographs each of which illustrates such a condition that the Al-based thermally sprayed film produced in Example 4 and applied to the surface of a base material is removed from the base material and more specifically, the photograph (a) is one showing such a condition observed for the Al-based thermally sprayed film according to the present invention, while the photograph (b) is one showing such a condition observed for the Al-based thermally sprayed film according to a conventional technique.
Figure 7:

Results of Tests for Film-Condition during Sputter Film-Forming Operation and Those of Tests for Evaluating Film-Removability: In the case of the Al-based thermally sprayed films according to the present invention, there was not observed, during the sputter film-forming operations, any exfoliation of the sputter-formed films for both of the uneven and flat base materials (see attached FIG. 5, in this respect, FIG. 5(a) relates to the case which made use of an uneven or rough base material and FIG. 5(b) relates to the case which made use of a flat or smooth base material), while in the case of the conventional Al-based thermally sprayed films, there was observed, during the sputter film-forming operations, exfoliation of the sputter-formed films for both of the uneven and flat base materials (see attached FIG. 6, in this respect, FIG. 6(a) relates to the case which made use of an uneven or rough base material and FIG. 6(b) relates to the case which made use of a flat or smooth base material). In other words, a part of the Al-based thermally sprayed film formed on the surface of the base material and provided thereon with the sputtered Cu film is peeled off as shown in FIG. 6(a) and the right hand edge of the Al-based thermally sprayed film formed on the surface of the base material and provided thereon with the sputtered Cu film is peeled off and turned up as shown in FIG. 6(b). Moreover, in the case of the Al-based thermally sprayed film according to the present invention, it was found that the thermally sprayed film provided thereon with a sputtered Cu film could easily be removed by immersing the same in water maintained at 80° C. for 19 minutes (see the photograph as shown in FIG. 7(a)) and it could easily be removed within 6 minutes upon the immersion at 96° C., while in the case of the conventional Al-based thermally sprayed film, it was found that the thermally sprayed film provided thereon with a sputtered Cu film was never peeled off when it was immersed in water maintained at 80° C. for 3 hours (see the photograph as shown in FIG. 7(b)) and it was never peeled off even when it was immersed in water maintained at 96° C. for 3 hours. In the case of the present invention, it was found that the warmed water contained precipitates of AlOOH and accordingly, Cu could be recovered with ease.

Example 5

Figure 8:
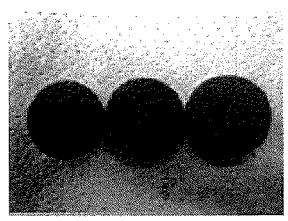
FIG. 8 shows photographs each of which illustrates the adhesion, to a base material, of the Al-based thermally sprayed film produced in Example 5, and more specifically, the photograph (a) is one observed for the Al-based thermally sprayed film according to the present invention, while the photograph (b) is one observed for the Al-based thermally sprayed film according to a conventional technique.
Figure 8:
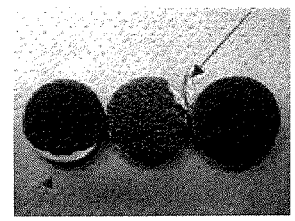

In this Example, the same procedures used in Example 4 were repeated except that an ITO film was formed according to the sputter film-forming technique instead of the Cu film used in Example 4 and formed according to the sputter film-forming technique to thus give a base material carrying an Al-based thermally sprayed film provided thereon with an ITO film adhered thereto. The base material was then treated with deionized water maintained at a desired temperature over a predetermined time period to thus inspect the Al-based film for its removability upon the immersion thereof in water. Separately, for the sake of comparison, an ITO film was deposited on the surface of the aforementioned conventional Al-based thermally sprayed film, which had been applied onto a base material, according to the sputtering technique and the film-removability thereof was likewise investigated according to the same method used above. The results thus obtained can be summarized as follows:
Test for Estimating Removability of Sputtered ITO Film:
    Thickness of Al-Based Thermally Sprayed Film: 150 to 200 μm;
    Temperature of Base Material: 280° C.;
    Thickness of Sputtered ITO Film: 0.7 mm;
    Sputtering Time Period: 72 hours.
Results of Tests for Evaluating Film-Condition during Sputter Film-Forming Operation and Those of Tests for Evaluating Film-Removability: In the case of the Al-based thermally sprayed films according to the present invention, there was not observed any exfoliation of the resulting film during the formation thereof according to the sputtering technique (see the photograph as shown in FIG. 8(a)). In the case of the conventional Al-based thermally sprayed films, however, there was observed the peeling off of the sputter-formed film during the film-forming process (see the photograph as shown in FIG. 8(b)). Moreover, likewise regarding the Al-based thermally sprayed films according to the present invention, it was found that the Al-based thermally sprayed film provided thereon with an ITO sputtering film could be removed with ease when immersing it in water maintained at 80° C. In the case of the conventional Al-based thermally sprayed film, however, the Al-based thermally sprayed film was never removed upon the immersion thereof in water maintained at temperatures of 80° C. and 96° C. In the case of the present invention, it was found that the warmed water contained precipitates of AlOOH and accordingly, residual ITO film (or In, Sn) could be recovered with ease.

Example 6

Figure 9:
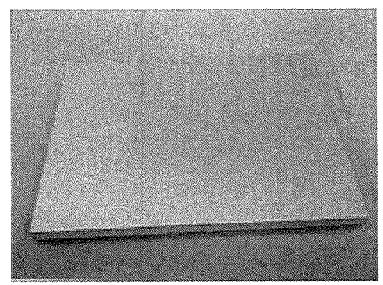
FIG. 9 shows photographs for illustrating the adhesion, to a base material, of the Al-based thermally sprayed film according to the present invention, which is produced in Example 6, and more specifically, the photograph (a) is one illustrating the adhesion of the Al-based thermally sprayed film to a base material whose surface is uneven or rough and the photograph (b) is one illustrating the adhesion of the Al-based thermally sprayed film to a base material whose surface is flat or smooth.
Figure 9:
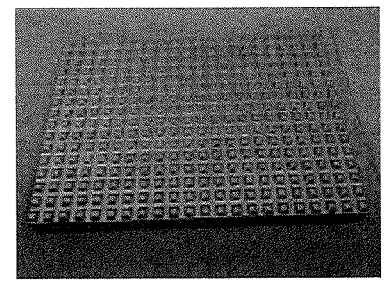
Figure 10:
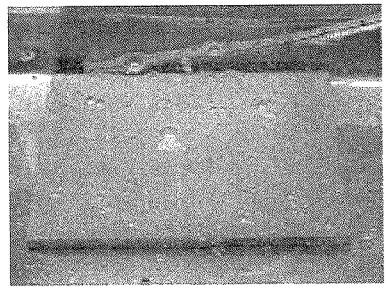
FIG. 10 shows photographs for illustrating the removability of the Al-based thermally sprayed film according to the present invention, which is produced and applied onto the surface of a base material in Example 6 and more specifically, the photograph (a) shows the condition observed for the Al-based thermally sprayed film immediately after the immersion thereof into water, the photograph (b) shows the condition observed for the film during the reaction thereof with water, and the photograph (c) shows such a condition that the Al-based thermally sprayed film is removed from the substrate (base material).
Figure 10:
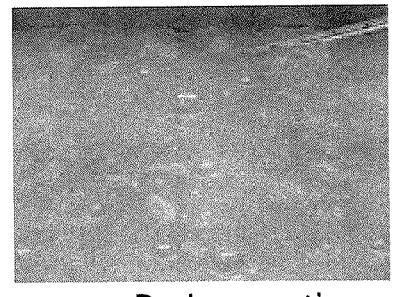
Figure 10:
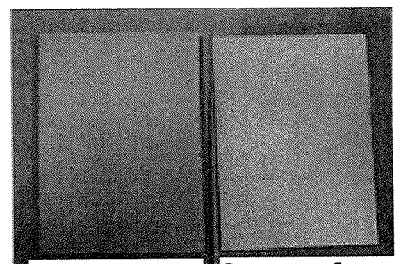

In this Example, the same procedures used in Example 4 were repeated except for the formation of an Mo film according to the sputtering technique, in place of the formation of a Cu film according to the sputtering technique to thus give each corresponding base material carrying an Al-based thermally sprayed film provided thereon with an Mo film and the resulting base material was then treated with deionized water maintained at a predetermined temperature over a desired time period to thus inspect the Al-based thermally sprayed film for the removability thereof. Separately, for the sake of comparison, an Mo film was deposited on the surface of the aforementioned conventional Al-based thermally sprayed film, which had been applied onto a base material, according to the sputtering technique and the removability thereof was likewise investigated according to the same method used above. The results thus obtained can be summarized as follows:
Test for Estimating Removability of Sputtered Mo Film:
    Thickness of Al-Based Thermally Sprayed Film: 150 to 200 μm;
    Temperature of Base Material: 220° C.;
    Thickness of Sputtered Mo Film: 0.7 mm;
    Sputtering Time Period: 72 hours.
Results of Tests for Evaluating Film-Condition during Sputter Film-Forming Operation and Those of Tests for Evaluating Film-Removability: In the case of the Al-based thermally sprayed films according to the present invention, there was not observed, during the sputter film-forming operations, any exfoliation of the sputter-formed films for both of the uneven and flat base materials (see attached FIG. 9, in this respect, FIG. 9(a) relates to the case which makes use of a flat or smooth base material and FIG. 9(b) relates to the case which makes use of an uneven base material). On the contrary, in the case of the conventional Al-based thermally sprayed films, there was observed, during the sputter film-forming operations, exfoliation of the sputter-formed films for both of the cases which made use of uneven and flat base materials, respectively. In addition, it was found, in the case of the Al-based thermally sprayed film according to the present invention, that the Al-based thermally sprayed film provided thereon with a sputtered Mo film could easily be removed by immersing the same in water maintained at 80° C. for only about 8 minutes (see the photographs as shown in FIGS. 10(a), 10(b) and 10(c)). Contrary to this, in the case of the conventional Al-based thermally sprayed film, the thermally sprayed film provided thereon with a sputtered Mo film could not be removed even when it was immersed in water maintained at 80° C. and 96° C.

In this connection, FIG. 10(a) shows the condition of the Al-based thermally sprayed film provided thereon with a sputtered Mo film immediately after the immersion thereof in deionized water maintained at a temperature of 80° C., FIG. 10(b) shows the condition of the same Al-based thermally sprayed film observed during the reaction thereof with water and FIG. 10(c) shows such a condition that the Al-based thermally sprayed film provided thereon with a sputtered Mo film is removed from the base material (substrate). At this stage, it was found that the warmed water contained precipitates of AlOOH and accordingly, residual Mo could be recovered with ease.

Example 7

In this Example, there were inspected Al-based thermally sprayed films for the weatherability thereof using a base material consisting of aluminum (40 mm×40 mm×20 mm thick) whose surface had been covered with an Al-based thermally sprayed film (film thickness: 200 μm) consisting of 4N Al-3.0% by mass In-0.2% by mass Si-0.2% by mass Ti prepared according to the method disclosed in Example 1. In this respect, the test for evaluating the weatherability used herein comprises the steps of introducing each sample into a temperature- and humidity-controlled furnace which was set at a temperature of 40° C. and a relative humidity of 85% (85% RH), then allowing the sample to stand over 6 hours and subsequently visually inspecting the surface conditions thereof. In addition, for the purpose of comparison, the Al-based thermally sprayed film consisting of 5N Al-3.0% by mass In (a conventional Al-based thermally sprayed film) was likewise inspected for the weatherability according to the foregoing method. The results thus obtained are shown in the attached FIGS. 11(a-1), (a-2), (b-1) and (b-2), respectively.

Figure 11:
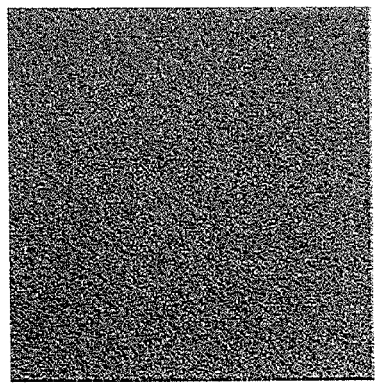
FIG. 11 shows a series of photographs each of which is herein given for illustrating the weatherability of the Al-based thermally sprayed film produced in Example 7 and more specifically, the photographs (a-1) and (a-2) are those observed for the conventional Al-based thermally sprayed film before and after the weatherability test, respectively and the photographs (b-1) and (b-2) are those observed for the Al-based thermally sprayed films according to the present invention likewise before and after the weatherability test, respectively.
Figure 11:
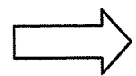
Figure 11:
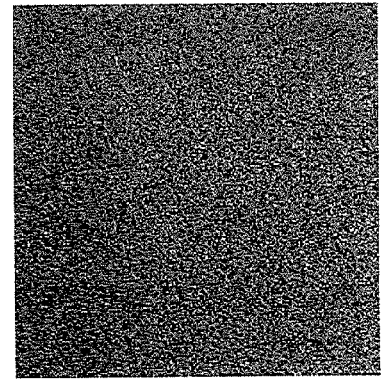
Figure 11:
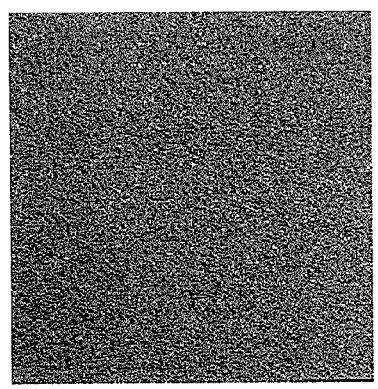
Figure 11:
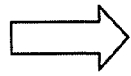
Figure 11:
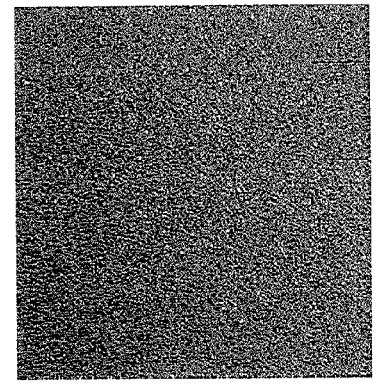

In the case of the conventional Al-based thermally sprayed film, there was not observed the formation of any dark spot on the surface of the base material prior to the weatherability test (see the photograph as shown in FIG. 11(a-1)), but it was found that an innumerable number of dark spots were formed on the surface of the base material after the completion of the weatherability test (see the photograph as shown FIG. 11(a-2)). Contrary to this, in the case of the Al-based thermally sprayed film according to the present invention, it was confirmed that any dark spot was not generated on the surface of neither the base material prior to the test nor that obtained after the test (see, the photographs as show in FIGS. 11(b-1) and 11(b-2) respectively). Thus, in the case of the Al-based thermally sprayed film according to the present invention, to which Si was added, it was found that the thermally sprayed film can be stored over a long period of time and it is never accompanied by the formation of any dark spot. Accordingly, it would be concluded that the use of this Al-based thermally sprayed film results in the considerable reduction of the possibility of generating particles during the film-forming operations.

INDUSTRIAL APPLICABILITY

If covering, with an Al-based thermally sprayed film consisting of the water-reactive Al-based thermally sprayed film according to the present invention, the surface of a constituent member for a film-forming chamber to be placed within a vacuum film-forming apparatus used for forming a thin film of a metal or a metal compound according to, for instance, the sputtering technique, the vacuum deposition technique, the ion-plating technique, or the CVD technique, any film inevitably adhered to the surface of this constituent member for a film-forming chamber during the film-forming process can be recovered by the removal thereof in a water-containing atmosphere. For this reason, the present invention can be used in the field which makes use of these film-forming apparatuses, for instance, the technical fields such as the semiconductor element-manufacturing fields and the electronics-related machinery and tools to thus increase the number of reuse of the constituent members for a film-forming chamber and to recover any film-forming material which contains various valuable metals.

What is claimed is:

1. A method for producing a water-reactive Al-based thermally sprayed film, comprising
melting a material comprising
Al;
2.0 to 3.5% by mass of In;
0.2 to 0.5% by mass of Si; and
0.13 to 0.25% by mass of Ti,
wherein all mass ratios are based on the total amount of Al,
wherein the In, Si and Ti are incorporated into the Al to form a resulting
molten material having a uniform composition; and
thermally spraying the molten material on the surface of a substrate, while quenching the sprayed molten material to thus solidify the same and to thereby form a film,
wherein after the water-reactive Al-based thermally sprayed film is subjected to an influence of a thermal hysteresis of an order of 300 to 350° C., the Al film is dissolved by being allowed to react with warm water maintained at a temperature ranging from 40 to 130° C.

2. A constituent member for a film-forming chamber of a film-forming apparatus, comprising a water-reactive Al-based thermally sprayed film produced according to the method as set forth in claim 1 on the surface thereof.

3. The constituent member for a film-forming chamber as set forth in claim 2, wherein the constituent member is an adhesion-inhibiting plate, a shutter or a mask.

4. A water-reactive Al-based thermally sprayed film, comprising
Al;
2.0 to 3.5% by mass of In;
0.2 to 0.5% by mass of Si; and
0.13 to 0.25% by mass of Ti,
wherein all mass ratios are based on a total amount of Al, and
wherein after the water-reactive Al-based thermally sprayed film, which is produced by melting a composite material comprising Al, In, Si and Ti as specified above; thermally spraying the molten material on the surface of a base material; and then solidifying the sprayed molten material through quenching is subjected to an influence of a thermal hysteresis of an order of 300 to 350° C., the Al-based thermally sprayed film is dissolved by being allowed to react with warm water maintained at temperature ranging from 40 to 130° C.

5. A constituent member for a film-forming chamber of a film-forming apparatus, comprising the water-reactive Al-based thermally sprayed film as set forth in claim 4 on a surface thereof.

6. The constituent member for a film-forming chamber as set forth in claim 5, wherein the constituent member is an adhesion-inhibiting plate, a shutter or a mask.

* * * * *